United States Patent [19]
Chern

[11] Patent Number: 5,302,870
[45] Date of Patent: Apr. 12, 1994

[54] APPARATUS FOR PROVIDING MULTI-LEVEL POTENTIALS AT A SENSE NODE

[75] Inventor: Wen-Foo Chern, Colorado Springs, Colo.

[73] Assignee: Micron Technology, Inc., Boise, Id.

[21] Appl. No.: 1,429

[22] Filed: Jan. 6, 1993

Related U.S. Application Data

[63] Continuation of Ser. No. 869,990, Apr. 15, 1992, abandoned, which is a continuation of Ser. No. 749,398, Aug. 23, 1991, Pat. No. 5,175,450.

[51] Int. Cl.$^5$ .......................... H03F 3/45; H03K 19/02
[52] U.S. Cl. ..................................... 307/530; 307/473; 307/491; 307/355; 307/542; 307/263
[58] Field of Search ............... 307/473, 491, 355, 530, 307/451, 542, 263

Primary Examiner—Margaret R. Wambach
Attorney, Agent, or Firm—Susan B. Collier

[57] ABSTRACT

A multi-level potential generating circuit that brings a sense node to three potentials by first grounding the node to a first potential equal to a reference potential and then floating the node to a substantially stabilized second potential equal to the reference potential plus a threshold voltage of an electrical device through which leakage current is pumped. The second potential is then decreased to a third potential greater than or equal to the first potential. The voltage sensing herein described typically is utilized in order to bias digit lines in a dynamic random access memory (DRAM) device during the active portion of the DRAM cycle and during an initiation of the precharge portion of the DRAM cycle. The second potential reduces the current leakage of the memory cell without utilizing an electrical device having a high threshold voltage. The initial momentary discharge of the sense node to the first potential allows a sense amplifier to behave like a conventional sense amplifier during initial sensing, thereby allowing a minimum digit/digit* sensing potential to approximate ground. Decreasing the second potential to a third potential at the initiation of the precharge cycle effects a decrease in the equilibrate potential of the digit lines, thereby increasing the "high logic window" as reflected in an increase in cell margin and a decrease in soft error rate (SER).

34 Claims, 5 Drawing Sheets

APPARATUS FOR PROVIDING MULTI-LEVEL POTENTIALS AT A SENSE NODE

This application is a continuation of application Ser. No. 07/869,990 filed Aug. 23, 1991, now abandoned which is a continuation of application Ser. No. 07/749,398 now U.S. Pat. No. 5,175,450.

BACKGROUND OF THE INVENTION

Present dynamic random access memory (DRAM) technology uses various materials which are electrically either conductive, insulating or semiconducting, although the completed semiconductor circuit device itself is usually referred to as a "semiconductor." One of the materials used is silicon, which is used as either single crystal silicon, amorphous silicon, or as polycrystalline silicon material, referred to as polysilicon or "poly" in this disclosure.

The memory cell typically stores a high logic level, "1," or a low logic level, "0." Since the memory cell utilizes a capacitor to store a charge representing the logic level, there is a possibility of leakage as a result of the capacitor discharging. There is no leakage associated with the low logic level since there is not a potential available to charge the cell to a higher potential. In contrast, when a high logic level is stored, leakage will eventually reduce the charge stored on the capacitor to a low logic level. A constant refresh is typically utilized to restore the high logic level.

In the operation of certain semiconductor circuit devices, such as dynamic random access memories (DRAMs), it is necessary to draw down the latch node (or the sense node) of the sense amplifier to a certain low potential, for example, a potential of $V_{SS}$ or $V_{TN}$. The biasing of this node enables the sense amplifier to sense a differential in potentials between potential sources, such as between digit and digit* lines (sense lines). It is advantageous to very rapidly bring the potential of the node to the low value in order to reduce the time for the sense amplifier to detect the differential in potential levels of the digit and digit* lines.

In one prior art technique, the sense amplifier was strobed to a ground potential and the substrate was pumped to $-2.5$ V with respect to ground. The pumping of $V_{SS}$ to $-2.5$ V resulted in current consumption which would have been unnecessary if substrate was set to be equal to ground.

If the sense amplifier node were connected through an electrical device to ground, such as a diode, then the sense amplifier node would go in potential to a level of ground plus $V_T$ of the electrical device with the substrate grounded. This achieves the same effect as the case where the substrate is pumped to 2.5 V. As the potential of the node approached ground plus $V_T$, the change in potential would tend to slow, resulting in the potential of the node hyperbolically approaching ground plus $V_T$. On the other hand, if the node was connected by a transistor to ground, then the potential of the node would rapidly drop past the desired ground plus $V_T$ and settle at ground potential. It would be desirable to have the potential of the node drop rapidly, as in the case of a transistor connection, but settle at a potential of ground plus $V_T$. Although an electrical device having a high threshold voltage reduces leakage current by increasing the potential of the sense node, it also reduces the high logic level that can written back to the cell.

U.S. Pat. No. 4,897,568, *Active Up-Pump for Semiconductor Sense Lines*, describes circuitry achieving an initial rapid drop in potential at the sense node with the sense node settling at a potential of ground plus $V_T$. The circuitry described in U.S. Pat. No. 4,897,568 allows the sense node to be charged to $V_{CC}/2$ during a precharge cycle for equilibration of the digit lines.

If the equilibration potential is reduced it follows that the minimum high level voltage parameter of the high logic state may also be reduced proportionally. Input data of a lower potential will be perceived as a relative high when compared to the lower equilibration potential. Thus potentials that were a marginally high logic state for an equilibration potential of $V_{CC}/2$ are seen as a high logic state when the equilibration potential is less than $V_{CC}/2$.

By widening the "high logic window" the reliability of the device is increased. The "high logic window" is the range of potentials which appear as a high logic level to a memory device. The window is defined by minimum and maximum voltage parameters of the high logic signal.

The cell signal is defined as the potential stored on the memory storage capacitor of a memory device. The cell margin is defined as the difference in potential between the cell signal and the potential of the digit/digit* lines of the memory device. The cell margin can be increased by retaining a given cell signal and decreasing the equilibrate potential of the digit lines. A larger cell margin increases the reliability of a memory device and reduces the soft error rate (SER). The SER is the number of errors experienced by a memory device during a fixed unit of time due to factors other than the memory device itself. The most common factor causing soft error is radiation.

SUMMARY OF THE INVENTION

The invention is a circuit for providing multi-level potentials at the sense node of a sense amplifier. The multi-level potentials effect optimal sensing of differential signals, minimal power requirements, increased reliability as a result of widening of the "high logic window," and reduction of the SER as a result of increasing the high cell margin.

A multi-level potential generating circuit uses voltage sensing to bring a sense node to a potential of $V_{SS}$ plus $V_T$ by first grounding the node to a first potential equal to a reference potential, $V_{SS}$, and then floating the node to a substantially stabilized second potential equal to the reference potential plus a threshold voltage, $V_T$, of an electrical device through which leakage current is pumped. The second potential is then decreased to a third potential, the third potential is equal to the first potential plus a delta voltage A having a value less than the threshold voltage. The third potential is generated by the multi-level potential generating circuit in response to an inactive row address strobe ($\overline{RAS}$) signal and an active sense signal at the initiation of a precharge cycle of the sense amplifier. The portion of the multi-level potential generating circuit responsive to the inactive $\overline{RAS}$ signal and active sense signal discharges the sense node to a potential less than the second potential.

The voltage sensing herein described typically is utilized in order to bias digit lines during the active cycle at the initiation of a precharge cycle of a DRAM device. Read and write operations are typically performed during the active cycle. The second potential reduces current leakage of the memory cell without utilizing an electrical device having a high threshold voltage. The initial momentary discharge of the sense node to the first potential allows the sense amplifier to behave like a conventional sense amplifier during initial sensing, thereby allowing a minimum digit/digit* sensing potential to approximate ground. The final reduction of the sense node to the third potential at the initiation of the precharge cycle effects a decrease in the equilibrate voltage of the digit lines during a precharge cycle, thereby reducing the minimum high logic level voltage parameter, increasing the "high logic window," and increasing the reliability of the device. Reducing the potential of the sense node to the third potential also increases the high logic level that can be written back to the cell, increases the cell margin and reduces soft error rate.

In conclusion, the invention effects a maximum cell signal and cell margin for both the high, 1, and low, 0, logic level at a tri-level sense node while minimizing leakage current. At the onset of the precharge cycle, the sense node potential is purposely reduced from $V_{SS}$ plus $V_T$ to $V_{SS}$ plus a delta voltage A less than $V_T$, causing the low cell margin to reduce by the same amount from $V_{SS}$ plus $V_T$ to $V_{SS}$ plus the delta voltage A. This reduction is effected prior to the activation of the wordline. The digit generation of the third potential lowers the equilibrate potential of the sense lines by one half the change in voltage between the second potential and the third potential. The change in voltage between the second potential and third potential will be called the delta voltage B. The gain in the low cell margin is equal to one half the delta voltage B. Since the equilibrate potential is reduced by one half the delta voltage B, the gain in the high cell margin is also one half the delta voltage B.

DETAILED DESCRIPTION OF THE INVENTION

In the preferred embodiment each of the circuit elements shown and described is formed as a part of a semiconductor circuit chip. The chip is typically utilized on an electronic circuit board. The described circuit functions find particular utility when integrated onto the chip, although it is possible to utilize the invention as one or more separate circuit elements.

Figure 1:
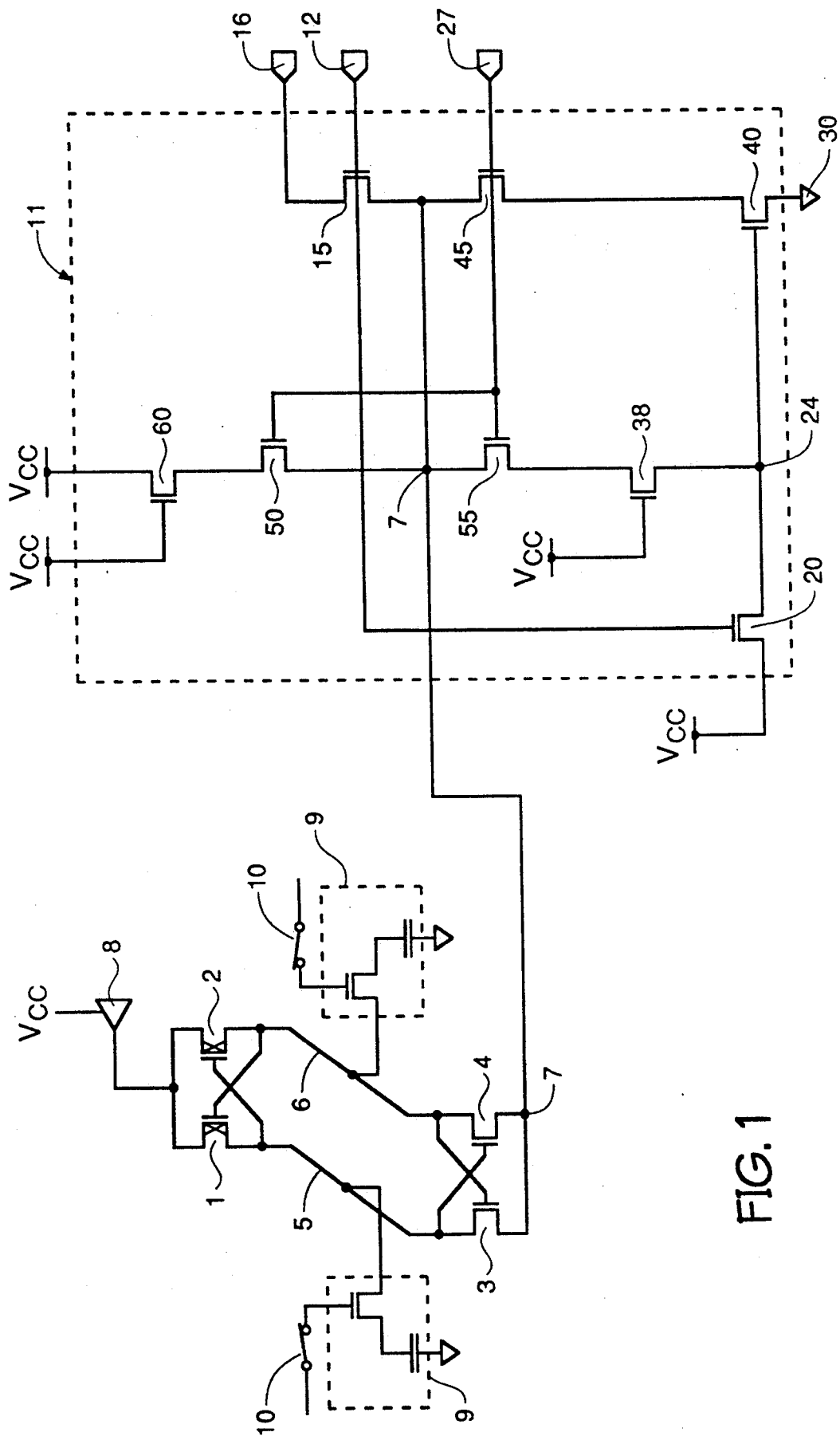
FIG. 1 depicts the active cycle circuit portion of the multi-level potential generating circuit of the invention.

Referring to FIG. 1, a sense amplifier consists of a plurality of cross-coupled metal-oxide semiconductor field effect transistors (MOSFETs) 1, 2, 3, and 4 for detecting differential (EMF) levels on digit 5 and digit* 6 lines (sense lines).

The n-channel MOSFETs 3 and 4 are connected at their sources to a sense node 7, which functions as a low level voltage (EMF) source and their gates are cross-coupled to each other's drains. Their drains are connected to the digit 5 and digit* 6 lines respectively, so that their gates are responsive to the opposite digit 5 or digit* 6 lines in order that they may sense the differential potentials on the digit 5 and digit* 6 lines.

Likewise, the sources of p-channel MOSFETs 1 and 2 are connected to a pull-up amplifier 8 and the drains of transistors 1 and 2 are connected to the digit 5 and digit* 6 lines, respectively. The gates of transistors 2 and 1 are cross-coupled to the digit 5 and digit* 6 lines respectively, in order that transistor 1 and 2 can sense differential high levels on the digit 5 and digit* 6 lines.

The pull-up amplifier 8 conducts from the $V_{CC}$ to transistors 1 and 2 in order to restore "one" or high logic levels in the array to their full potential after a "read" operation or during a refresh cycle. This helps to restore the "one" level of the signal which had just been read.

In order to bring the sense node 7 to a desired potential, an N latch charge pump, which functions as a pull-down amplifier, must conduct current from the sense node 7. If the N latch charge pump conducts current to the ground through a device (such as a diode) which has a threshold voltage ($V_T$), the potential at the sense node 7 will slowly pump down to a potential of ground plus $V_T$.

The speed that the sense node 7 is pumped down controls the time required to read the individual cells 9 accessed by switches 10 in the memory array, and consequentially the access speed. The access speed is generally considered to be the speed of the device.

The operation of the sense node 7 at a potential of ground plus $V_T$ reduces the leakage current thus increasing maximum time between refresh cycles and the reliability of the part. The cell margin of the part is reduced, however, because the minimum operating voltage $V_{CC}$ is increased due to the increase in the sense node potential.

The invention increases the cell margin in two steps. First, the sense node 7 is conducted directly to ground potential before being permitted to float up to a potential of ground plus $V_T$. The sense node is then maintained at approximately the level of ground plus $V_T$, rather than continuing to the low ground potential. In other words, the sense node potential is first brought rapidly to a potential close to ground, decreasing access time and increasing the operating margin, and then the sense node potential increases to a potential of ground plus $V_T$. This maximizes the time between refresh cycles.

Second, the sense node potential of ground plus $V_T$ is reduced at the end of the active cycle and at the initiation of the precharge cycle. This final reduction of the sense node potential is precipitated by an inactive row address strobe ($\overline{RAS}$) signal. By reducing the sense node voltage just prior to equilibration the equilibrate potential is lowered. The lower equilibrate voltage increases the "high level logic window," increases the one's level margin, and increases the high logic level that can be written back to the cell, thereby increasing the reliability of the chip.

The invention is a multi-level potential generating circuit for generating first, second, and third potentials at the sense node 7. Thus, the multi-level potential generator of the invention replaces the conventional pull-down amplifier connected to sense node 7. The sense node 7 is quickly discharged to the first potential in order to facilitate sensing of data by the sense amplifier in a dynamic random access memory (DRAM) device. The second potential is greater than the first potential. The third potential lowers the potential of the sense node 7 from the second potential to a potential equal to or greater than the first potential. The third potential effects a decrease in the equilibrate potential.

Figure 2:
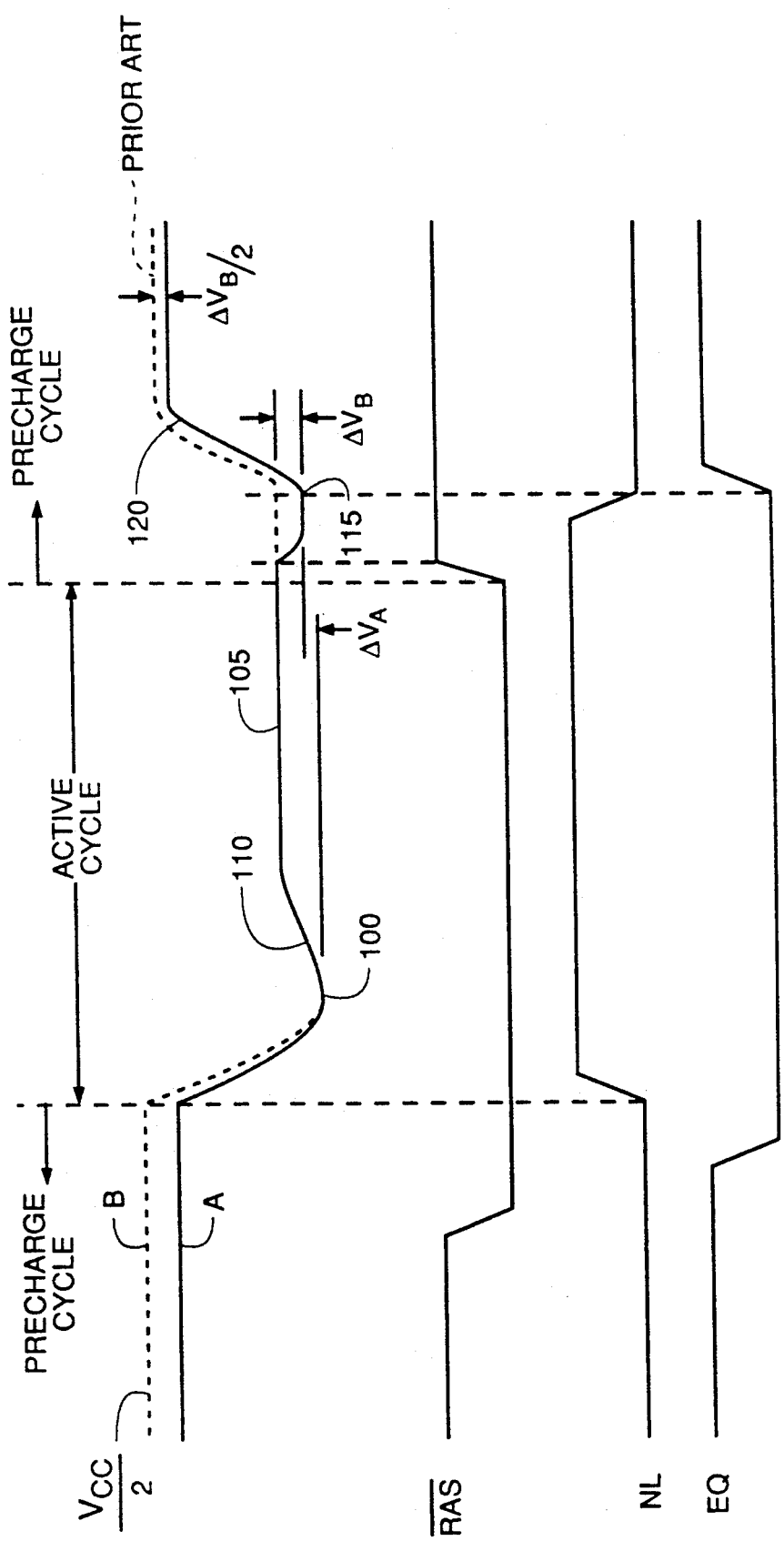
FIG. 2 graphically depicts the potentials at the sense node in the prior art and in the present embodiment of the invention in relation to control signals.

FIG. 2 compares the potentials generated at the sense node by the invention, represented by solid line A, to the potentials at the sense node in the prior art, represented by dotted line B. The first, second and third potentials at the sense node are shown in relation to row address strobe ($\overline{RAS}$), equilibrate, and sense signals, shown in timing diagram format. Although voltages are vertically expressed and time is horizontally expressed, the voltages at the sense node are shown to explain the operation of the multi-level potential generating circuit and do not represent actual measurements of voltage over time. A delta voltage A is shown as the change in voltage between the first and third potentials, and delta voltage B is shown as the change in voltage between the second and third potentials.

The active cycle circuit portion 11 of the multi-level potential generating circuit of the DRAM device is shown in FIG. 1. During a precharge cycle an active equilibrate signal at an equilibrate terminal 12 activates transistor 15 and allows an equilibrate potential generator connected to terminal 16 to charge sense node 7 and digit/digit* lines 5 and 6 to an equilibrate potential. Those skilled in the art are familiar with various equilibrate means for generating an equilibrate potential. The actual equilibrate potential generator implemented by the designer is optional to the present inventor and various equilibrate potential generators may be used. The active equilibrate signal also activates transistor 20 and precharges common node 24 to a potential equal to $V_{CC}$ minus the voltage loss, $V_{T20}$, across transistor 20. During the precharge cycle the sense terminal 27 accepts an inactive sense signal, isolating sense node 7 from a reference potential at reference node 30. A diode configuration comprising transistors 38 insures that there is no leakage current between nodes 7 and 24.

During an active cycle the active circuit portion 11 accepts an active sense signal at the sense terminal 27 and activates transistors 45 and 50, since the gate of transist 40 is biased at $V_{CC}-V_{T20}$. The sense node 7 now has a direct path to the reference potential through transistors 45 and 40. Thus the active sense signal allows the sense node 7 to discharge to a first potential substantially equal to the reference potential which is substantially equal to a ground potential.

The active sense signal also activates transistor 55, thereby biasing the diode configuration comprising transistor 60. Transistors 60 and 55 are much smaller than transistor 45 in series with transistor 40 and therefore the high potential part of the circuit (60 and 55) has a relatively high internal resistance. Because series transistors 55 and 60 have much more resistance than transistor 45 and 40, the sense node 7 is floated only to a ground potential plus the threshold voltage of transistor 40. If the sense node 7 were to be left floating in a long $\overline{RAS}$ low cycle, the sense node 7 may leak to ground potential. The sense node 7 is brought to $V_T$ above ground as a result of the circuit path which includes transistors 55 and 60 being highly resistive. Therefore, substantially more current leaks through transistor 45 until the potential of the sense node 7 approaches $V_T$ above ground potential. Also the potential at node 24 regulates the gating of transistor 40, such that current through transistor 40 is limited when the potential at node 24 approaches the potential of sense node 7.

Therefore, transistor 55 pulls the sense node 7 ground to $V_T$ above ground, and maintains the sense node 7 at $V_T$ above ground over long periods of the active cycle. If transistor 55 was not present, the sense node 7 would float down to ground. The potential of ground plus the threshold voltage of transistor 40 is the second potential generated by the multi-level potential generator circuit.

The equilibrating potential during precharge is reduced by lowering the voltage of the sense node 7 to the third potential just prior to equilibration of the digit lines in the precharge cycle. By reducing the potential of the sense node 7 by a delta voltage B, the equilibrate potential is reduced by an amount equal to the delta voltage B divided by two. The invention comprises three embodiments of a precharge cycle circuit to reduce the sense node potential to the third potential. Each of the three embodiments utilizes preexisting circuit signals to generate the third potential. The circuit signals comprise a $\overline{RAS}$ signal transitioning to an inactive logic state, in this case high, in conjunction with a sense signal having an active logic state, in this case high. The duration of the active sense signal controls the duration of the third potential at the sense node 7. When the sense signal transitions low, the $\overline{RAS}$ signal transitions high, and the equilibrate signal transitions high, the sense node 7 is equilibrated to the reduced equilibration voltage due to the third potential generated prior to equilibration by the invention. Therefore, the equilibrate potential is reduced without relying on the equilibrate potential generator to do the work.

Figure 3:
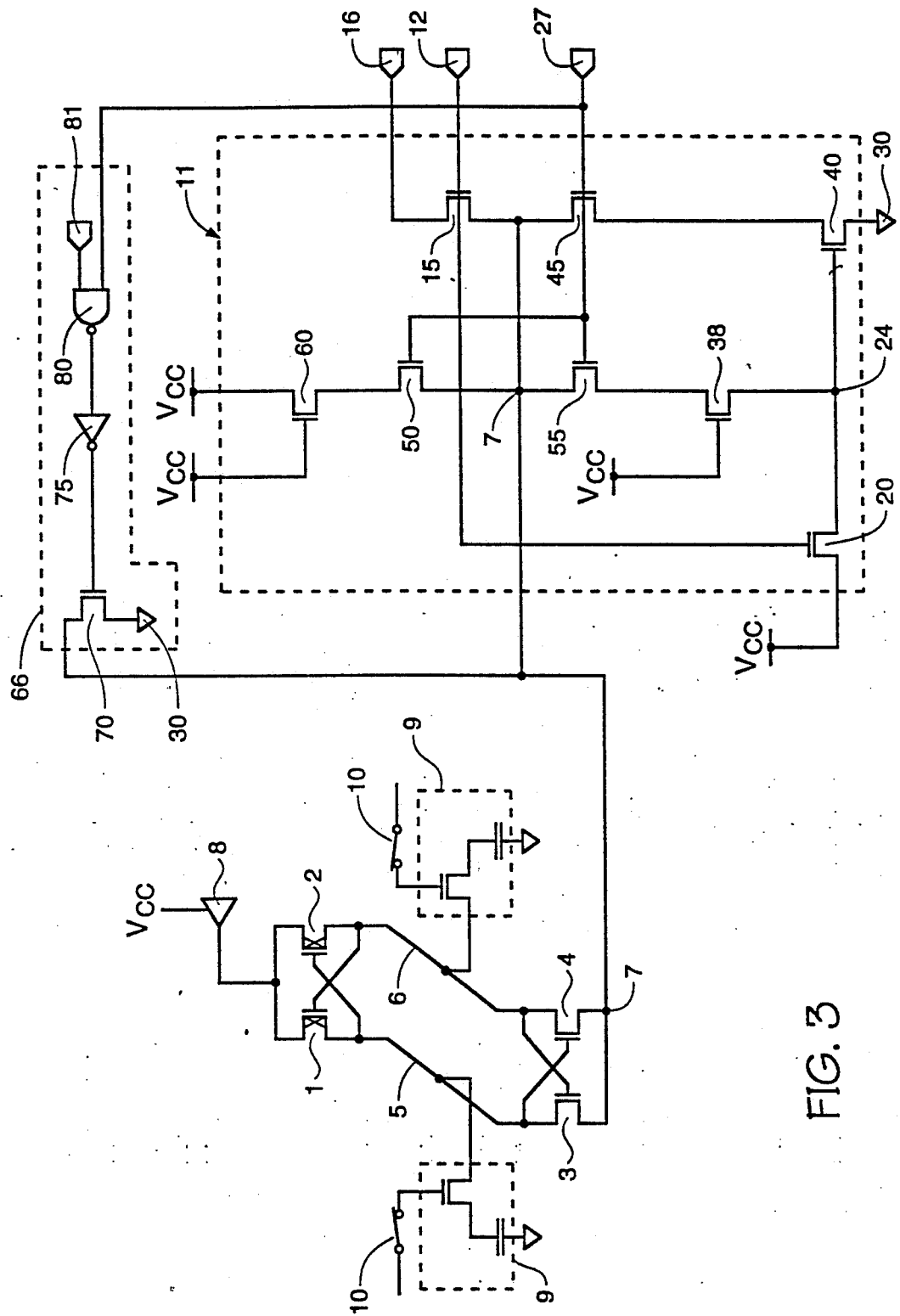
FIG. 3 is the circuit of FIG. 1 modified to depict a first embodiment of the invention comprising a precharge circuit portion.

In the first embodiment the multi-level potential generating circuit comprises active cycle circuit 11 of FIG. 2 modified to include a precharge cycle circuit 66 as shown in FIG. 3. The precharge cycle circuit 66 comprises a transistor 70 interposed between the sense node 7 and reference node 30. The gate terminal of transistor 70 is connected to the output of an inverter 75, the input of inverter 75 is connected to the output of an NAND gate 80 having a $\overline{RAS}$ input terminal 81 and the sense input terminal 27 for accepting a $\overline{RAS}$ signal and the sense signal respectively. The transistor 70 remains deactuated during the active cycle since the active $\overline{RAS}$ signal is low. At the end of the active cycle and at the initiation of the precharge cycle, $\overline{RAS}$ transitions high. Since the sense signal remains high for a period of time after $\overline{RAS}$ is deactivated, the transistor 70 is actuated and the sense node 7 is brought to the third potential. The third potential is greater than or equal to the first potential and less than the second potential. It is equal to the first potential plus delta voltage A, the voltage loss across transistor 70. Therefore, the value of the third potential is determined by the size of transistor 70 and the length of time node 7 is discharged through transistor 70. The voltage difference between the second and third potentials is the delta voltage B. The sense signal is deactivated during precharge and transistor 70 is deactivated and the sense node 7 equilibrates to a potential equal to a value of the original equilibrate potential minus half of the delta voltage B.

Figure 4:
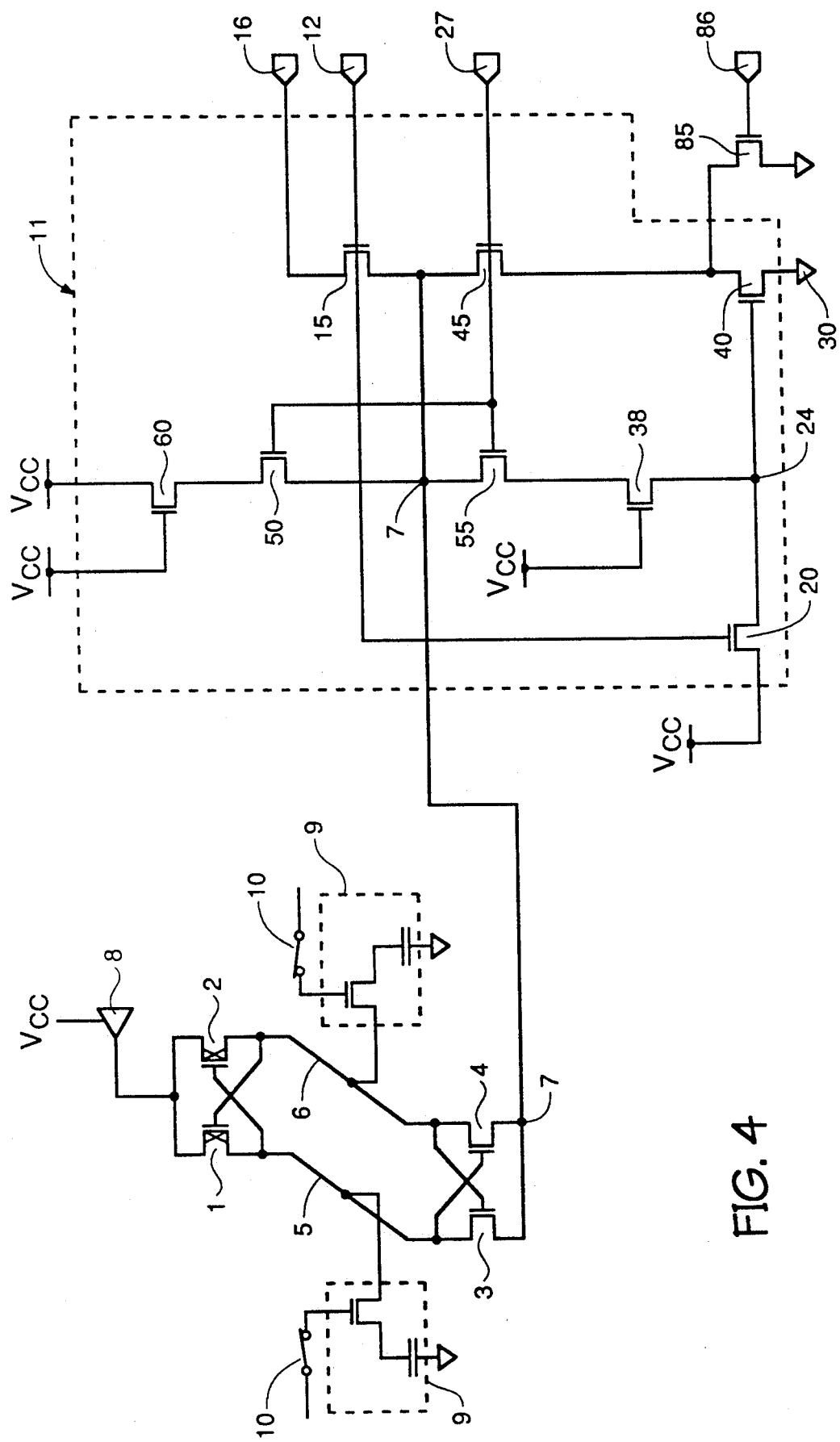
FIG. 4 is the circuit of FIG. 1 modified to depict a second embodiment of the invention comprising a precharge circuit portion.

A second embodiment, shown in FIG. 4, comprises a transistor 85 connected in parallel to transistor 40. The precharge cycle circuit comprises transistors 45 and 85. The gate of transistor 85 is connected to $\overline{RAS}$ terminal 86. Transistor 85 is actuated with an inactive $\overline{RAS}$ signal and transistor 45 is activated with an active sense signal.

Activated transistors 45 and 85 allow the potential of the sense node 7 to attain the third potential which approaches the reference potential. The third potential is greater than the first potential and less than the second potential. It is equal to the first potential plus the voltage loss across transistors 45 and 85. The effect of transistor 40 is negligible since the gate voltage on transistor 85 induces a large current through transistor 85, discharging node 7. As node 7 discharges, the current through transistor 40 decreases. Therefore, the value of the third potential is determined by the size of transistors 45 and 85, and the length of time node 7 is discharged through transistors 45 and 85. The voltage difference between the second and third potentials is the delta voltage B. When the sense signal is deactivated, transistor 45 is deactivated, transistor 85 is in effective, and the sense node 7 equilibrates to a potential equal to a value of the original equilibrate potential minus half of the delta voltage B.

Figure 5:
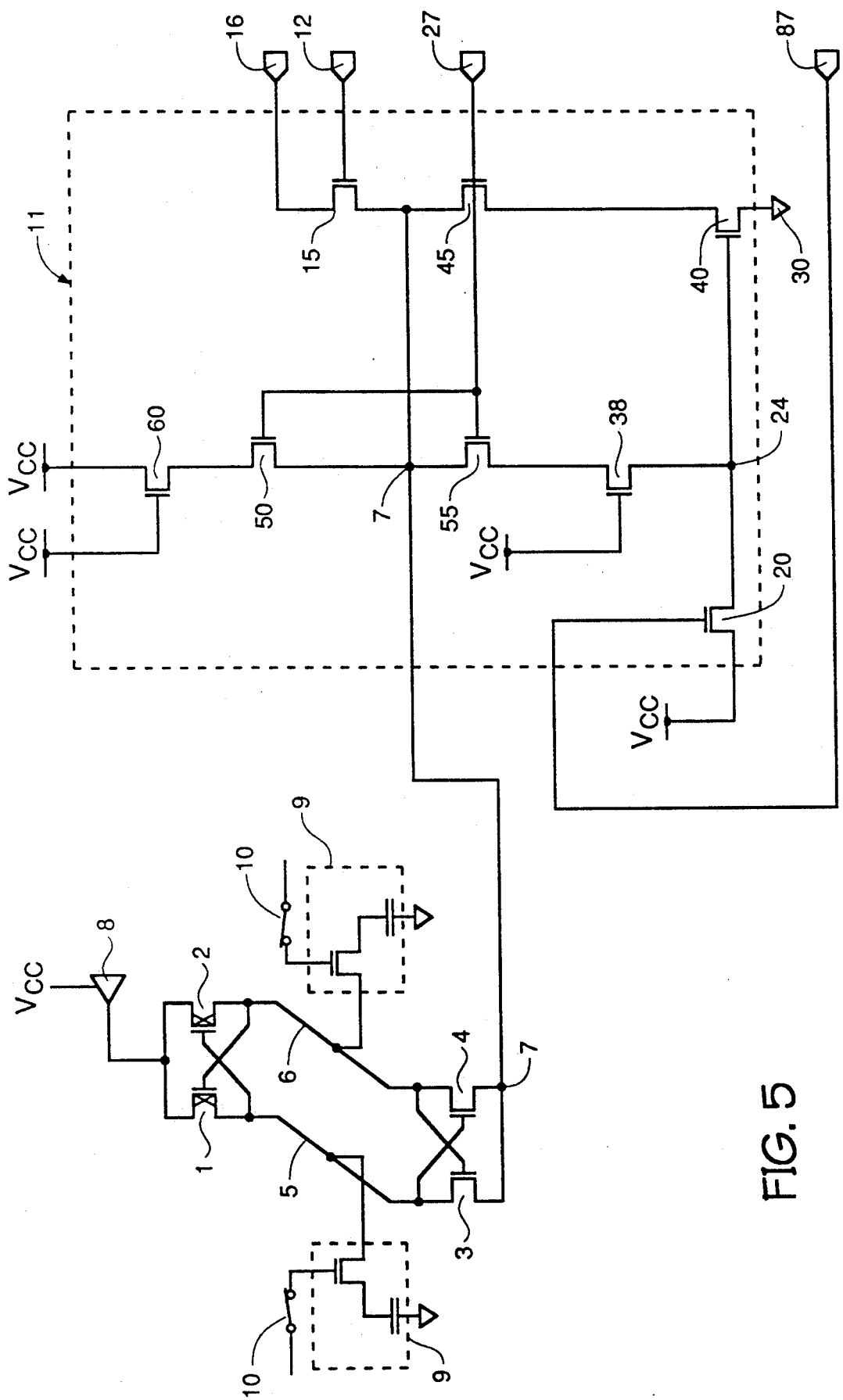
FIG. 5 is the circuit of FIG. 1 modified to depict a third embodiment of the invention comprising a precharge circuit portion.

In the third embodiment, shown in FIG. 5, the gate of transistor 20 is connected to the $\overline{RAS}$ terminal 87 rather than the equilibration terminal. The function of the equilibration signal to actuate transistor 20 and precharge node 24 is now accomplished by the inactive $\overline{RAS}$ signal during precharge.

At the initiation of the precharge cycle, $\overline{RAS}$ returns to the inactive logic state and the sense signal is in an active logic state. The active $\overline{RAS}$ signal activates transistor 20 which increases the voltage on node 24 and consequently the current through transistor 40, since transistors 40 and 45 are activated by the active logic state of the sense signal. The increase in current through transistor 40 decreases the voltage on node 7 to the third potential. The third potential is greater than or equal to the first potential and less than the second potential. It is equal to the reference potential plus the voltage loss across transistors 40 and 45. Therefore, the value of the third potential is determined by the size of transistors 40 and 45 and the length of time node 7 is discharged through transistors 40 and 45. The voltage difference between the second and third potentials is the delta voltage B. The sense signal is deactivated during precharge and transistor 70 is deactivated, transistor 40 is ineffective, and the sense node 7 equilibrates to a potential equal to a value of the original equilibrate potential minus half of the delta voltage B. In the third embodiment, the precharge cycle circuit comprises transistors 20, 40 and 45.

FIG. 2 depicts the potential of the sense node 7 lowered to hyperbolically settle to a quiescent voltage, but only after the potential is within a desired voltage range. The ability of the multi-level potential generator circuit to first conduct to ground potential at 100 and then to conduct to a potential of ground plus $V_T$ at 105 causes the hyperbolic portions 110 of Curves A to be truncated at the desired potential at 105 prior to the final reduction to the third potential 115 and just prior to equilibration of the digit lines at 120. It can be seen from the figure that the equilibrate potential is reduced from the equilibrate potential of the prior art. The charge in the equilibrate potential is equal to half of the change in potential between the second potential to the third potential.

In all three embodiments the sense node 7 is equilibrated during a precharge cycle to a potential lower than the equilibrate potential provided by the equilibrate potential generator. The decreased equilibrate potential is a result of the generation of the third potential by the multi-level potential generation circuit of the invention. The invention increases the cell margin increasing reliability reflected in a reduction of the SER.

Unless otherwise specified, the transistors comprising the invention are n-channel MOSFETs. The diode configurations may comprise more than one transistor configured as a diode.

Where electrical functions and connections are described, it is understood that it is possible, within the scope of this invention, to use equivalent circuits to perform the described functions. As an example, a transistor can be used as a diode or resistor. Likewise, two electrical components which are connected may have interceding components which physically separate the two components. "Connected" is therefore intended to include components which are in electrical communication despite intervening components.

Although the invention has been described in terms of a DRAM, the circuit has utility in other circuits where it is desired to rapidly reduce voltage and then permit the voltage to remain at a desired level before reducing it to a third level. Modification to the circuitry may also be implemented without detracting from the concept of the invention. The actual implementation is not critical to the concept of the invention. Accordingly, the invention should be read as limited only by the claims.

What is claimed is:

1. A sense node in electrical communication with and responsive to a multi-level potential generating circuit, such that the sense node attains potentials generated by the multi-level potential generating circuit, said multi-level potential generating circuit comprising:
   a) a first cycle circuit having;
      i) a first electrical device for discharging a potential of the sense node to a first potential substantially equal to a reference potential, said first electrical device electrically interposed between the sense node and a reference node, said reference node connectable to said reference potential, said first electrical device discharging the potential of said sense node when coupled to said sense node through a first switching device when a switching logic level is maintained at a control input node of said first electrical device, said control input node precharged to said switching logic level through a second switching device, said second switching device coupling said switching logic level to said control input node from a supply node when actuated, and isolating said control input node from said supply node when deactuated, said supplying node connectable to a supply potential, the sense node attaining a second potential subsequent to the potential discharging to said first potential, said second potential substantially equal to said first potential plus a potential equal to a threshold voltage of said first electrical device; and
      ii) a second electrical device electrically interposed between the sense node and said supply node for pulling the potential of said sense node to said second potential, said second electrical device activated by a sense signal having active and inactive states; and
   b) a second cycle circuit for discharging said second potential of the sense node to a third potential having a value less than said second potential, the discharging of said second potential to said third potential performed sufficiently later than the pulling of the potential of the sense node to said second potential such that an interim time period exists during which the second potential remains at the sense node, said interim time period interposed between a time period wherein said first potential is effected at said sense node and a time period wherein said third potential is effected at said sense node, wherein said second potential is greater than said first potential and wherein said second potential is greater than said third potential.

2. The multi-level potential generating circuit of claim 1, wherein said multi-level potential generating circuit is a portion of a semi-conductor memory device.

3. The multi-level potential generating circuit of claim 1, wherein said multi-level potential generating circuit is incorporated in a dynamic random access device.

4. The multi-level potential generating circuit of claim 3, wherein said first and second potentials are generated during an active cycle of said dynamic random access device and wherein said third potential is generated during a precharge cycle of said dynamic random access device.

5. The multi-level potential generating circuit of claim 1, wherein said first cycle circuit further comprises a diode configuration electrically coupled between said sense node and said control input node upon the actuation of a third switching device by said sense signal, wherein said diode configuration prevents leakage current between the sense node and said control input node and limits a current through said first electrical device as the logic level at the control input node approaches the potential at the sense node.

6. The multi-level potential generating circuit of claim 5, wherein said first and second potentials are generated in response to said sense signal having said active state, said first switching device being activated by said active state of said sense signal.

7. The multi-level potential generating circuit of claim 5, wherein a resistance of said second electrical device and a resistance of said diode configuration is much higher than a resistance of said first electrical device thereby allowing more current to leak through said first electrical device thus increasing the potential of the sense node to said second potential.

8. The multi-level potential generating circuit of claim 1, wherein said second cycle circuit comprises a third electrical device interposed electrically between the sense node and said reference node, said third electrical device, when actuated, capable of passing electrical current between said reference node and the sense node, said third potential substantially equal to said reference potential plus at least a voltage loss across said third electrical device, said third electrical device actuated in response to at least a select signal, said select signal having active and inactive states.

9. The multi-level potential generating circuit of claim 8, wherein said sense signal in conjunction with said select signal determines a logic level of an input signal to a control terminal of said third electrical device.

10. The multi-level potential generating circuit of claim 9, wherein said third electrical device is activated in response to said select signal having said inactive state and said sense signal having said active state.

11. The multi-level potential generating circuit of claim 8, wherein said third electrical device is interposed between said first switching device and said reference node, a current passing through said third electrical device being greater than a current passing through said first electrical device thereby reducing the potential on said sense node to said third potential, said third potential substantially equal to said reference potential plus a voltage loss across said third electrical device plus a voltage loss across said first switching device.

12. The multi-level potential generating circuit of claim 11, wherein said third electrical device is activated in response to said select signal having said inactive state in conjunction with said first switching device being actuated with said sense signal having said active state, said inactive state of said select signal turning on said third electrical device harder than the switching logic level at said control input turns on said first electrical device.

13. The multi-level potential generating circuit of claim 9 further comprising:
   a) a sense input terminal for accepting said sense signal; and
   b) a select terminal for accepting said select signal.

14. The multi-level potential generating circuit of claim 1, wherein said first cycle circuit further comprises an equilibrate terminal for accepting an equilibrate signal having active and inactive states, said active state of said equilibrate signal allowing said sense node to attain an equilibrate potential by coupling the sense node to an equilibrate means.

15. The multi-level potential generating circuit of claim 14, wherein said third potential is sensed at the sense node prior to the sense node being coupled to said equilibrate means, said third potential lowering said equilibrate potential on the sense node from a value that would be sensed at the sense node if said second potential were to be sensed at the sense node prior to the coupling of the equilibrate potential to the sense node.

16. The multi-level potential generating circuit of claim 15, wherein said active state of said equilibrate actuates said second switching device and said inactive state of said equilibrate signal deactuates said second switching device.

17. The multi-level potential generating circuit of claim 1, wherein said second cycle circuit comprises a select terminal for accepting a select signal having active and inactive states, said select terminal comprising a control terminal of said second switching device.

18. The multi-level potential generating circuit of claim 17, wherein said inactive state of said select signal actuates said second switching device and said active state of said select signal deactuates said second switching device.

19. The multi-level potential generating circuit of claim 17, wherein said select signal transitions form said active state to said inactive state when said sense node is maintaining said second potential, said transitioning coupling said high logic level to said control input node thereby actuating said first electrical device and reducing said second potential to said third potential, said third potential substantially equal to said reference potential plus the sum of the voltage loss across said first electrical device and said first switching device.

20. The multi-level potential generating circuit of claim 19, wherein said multi-function logic circuit is a portion of a semiconductor memory device.

21. The multi-level potential generating circuit of claim 20, wherein said multi-function potential generating circuit is incorporated into a dynamic random access memory device.

22. The multi-level potential generating circuit of claim 21, wherein said select signal is an active low row address strobe signal.

23. The multi-level potential generating circuit of claim 19, further comprising an equilibrate terminal for accepting an equilibrate signal having active and inactive states, said active state of said equilibrate signal allowing said sense node to attain an equilibrate potential by coupling the sense node to an equilibrate means.

24. The multi-level potential generating circuit of claim 23, wherein said third potential is sensed at the sense node prior to the sense node being coupled to said equilibrate means, said third potential lowering said equilibrate potential on the sense node from a value that would be sensed at the sense node if said second potential were to be sensed at the sense node prior to the coupling of the equilibrate potential to the sense node.

25. The multi-level potential generating circuit of claim 1, further comprising:
   a) at least one pair of sense lines capable of attaining an equilibrate potential;
   b) a first pair of cross-coupled transistors connected between said sense node and the pair of sense lines, said first pair of cross-coupled transistors being cross-connected so that a control terminal of each transistor of said first pair is connected to a first terminal of the other transistor of said first pair, a second terminal of each transistor connected to said sense node;
   c) a pull-up device for coupling said sense lines to said supply potential; and
   d) a second pair of cross-coupled transistors connected between said pull-up device and the pair of sense lines, said second pair of cross-coupled transistors being cross-connected so that a control terminal of each transistor of said second pair is connected to a first terminal of the other transistor of said second pair, a second terminal of each transistor connected to said pull-up device, and wherein said first, second and third potentials generated by the multi-function logic circuit have a value less than a value of the potential coupled to said sense liens by said pull-up device.

26. The multi-level potential generating circuit of claim 1, wherein said third potential is greater than said first potential.

27. The multi-level potential generating circuit of claim 1, wherein said third potential is substantially equal to said first potential.

28. A circuit for reducing an equilibrate potential on a low voltage sense node on a semiconductor memory device, said equilibrate potential generated by an equilibrate means and coupled to the low voltage sense node through a coupling means, said circuit comprising:
   a) at least one pair of sense lines capable of attaining the equilibrate potential;
   b) a pair of transistors connected between the low voltage sense node and the pair of sense lines, and each transistor having respective gates cross connected to a first terminal of the other, a second terminal of each transistor connected to the low voltage sense node; and
   c) circuitry for effecting a potential at the low voltage sense node to a first, second, and third potential, respectively, prior to the coupling of the equilibrate potential to the low voltage sense node, wherein said second potential is effected at said sense node during an interim time period exists during which the second potential remains at said second potential, said interim time period interposed between a time period wherein said first potential is effected at said sense node and a time period wherein said third potential is effected at said sense node, wherein said second potential is greater than said first potential and wherein said second potential is greater than said third potential, wherein effecting said third potential at the low voltage sense node lowers said equilibrate potential when said equilibrate potential is coupled to said low voltage sense node through said coupling means, said first, second and third potentials having a value less than said lowered equilibrate potential.

29. The circuit for reducing an equilibrate potential on the low voltage sense node as specified in claim 28, wherein said circuitry for effecting a potential at the low voltage sense node further comprises:
   a) a first cycle circuit having;
      i) a first electrical device for discharging the potential of the low voltage sense node to the first potential substantially equal to a reference potential, said first electrical device electrically interposed between the low voltage sense node and a reference node, said reference node connectable to said reference potential, said first electrical device discharging said low voltage sense node when coupled to said low voltage sense node through a first switching device when a switching logic level is maintained at a control input node of said first electrical device, said control input node precharged to said switching logic level through a second switching device, said second switching device coupling said switching logic level to said control input node from a supply node when actuated, and isolating said control input node from said supply node when deactuated, said supply node connectable to a supply potential, the low voltage sense node attaining the second potential subsequent to discharging to said reference potential, said second potential substantially equal to said first potential plus a potential equal to a threshold voltage of said first electrical device; and
      ii) a second electrical device electrically interposed between the low voltage sense node and said supply node for pulling said low voltage sense node to the second potential, said second electrical device activated by a sense signal having active and inactive states; and
   b) a second cycle circuit for discharging said second potential of the low voltage sense node to the third potential having a value less than the second potential, said discharging of the second potential to the third potential performed sufficiently later than said pulling said low voltage sense node to second potential such that an interim time period during which the second potential remains at said second potential, said interim time period interposed between a time period wherein the first potential is effected at said low voltage sense node and a time period wherein the third potential is effected at said low voltage sense node, wherein the second potential is greater than the first potential and wherein the second potential is greater than the third potential.

30. A multi-level potential generating means for generating a first, second, and third potential at a sense node comprising:
  a) a first cycle circuit having;
    i) a first discharge means for discharging a potential of the sense node to the first potential substantially equal to a reference potential; and
    ii) a pulling means for pulling the potential of the sense node to the second potential subsequent to the potential of the sense node discharging to the first potential, the second potential being greater than the first potential; and
  b) a second cycle circuit having;
    a second discharge means for discharging the second potential of the sense node to the third potential, the discharging of the second potential to the third potential performed sufficiently later than the pulling of the potential of the sense node to the second potential such that an interim time period exists during which the second potential remains at the sense node, said interim time period interposed between a time period wherein the first potential is effected at the sense node and a time period wherein the third potential is effected at the sense node, the second potential being greater than the third potential.

31. A sense node in electrical communication with and responsive to a multi-level potential generating circuit, such that the sense node attains potentials generated by the multi-level potential generating circuit, said multi-level potential generating circuit comprising:
  a) a first cycle circuit having;
    i) a first electrical device for discharging a potential of the sense node to a first potential substantially equal to a reference potential, said first electrical device electrically interposed between the sense node and a reference node, said reference node connectable to said reference potential; and
    ii) a second electrical device for pulling the potential of the sense node to a second potential subsequent to the potential of the sense node discharging to said first potential, said second potential substantially equal to said first potential plus a potential equal to threshold voltage of said first electrical device, said second electrical device electrically interposed between the sense node and a supply node, said supply node connectable to a supply potential; and
  b) a second cycle circuit for discharging said second potential of the sense node to a third potential, the discharging of said second potential to said third potential performed sufficiently later than the pulling of the potential of the sense node to said second potential such that an interim time period exists during which the second potential remains at the sense node, said interim time period interposed between a time period wherein said first potential is effected at the sense node and a time period wherein said third potential is effected at the sense node, wherein said second potential is greater than said first potential and wherein said second potential is greater than said third potential.

32. The multi-level potential generating circuit of claim 31, wherein said multi-level potential generating circuit is a portion of a semi-conductor memory device.

33. The multi-level potential generating circuit of claim 31, wherein said multi-level potential generating circuit is incorporated in a dynamic random access device.

34. The multi-level potential generating circuit of claim 33, wherein said first and second potentials are generated during an active cycle of said dynamic random access device and wherein said third potential is generated during a precharge cycle of said dynamic random access device.

* * * * *